US006365058B1

(12) United States Patent
Beatty et al.

(10) Patent No.: US 6,365,058 B1
(45) Date of Patent: Apr. 2, 2002

(54) METHOD OF MANUFACTURING A FLUID EJECTION DEVICE WITH A FLUID CHANNEL THERETHROUGH

(75) Inventors: Christopher Beatty; Naoto Kawamura, both of Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/378,230

(22) Filed: Aug. 19, 1999

Related U.S. Application Data

(62) Division of application No. 08/956,235, filed on Oct. 22, 1997.

(51) Int. Cl.[7] .......................... B41J 2/04; H01L 21/302

(52) U.S. Cl. .............................. 216/27; 347/63; 347/65

(58) Field of Search .............................. 216/27; 347/63, 347/65; 438/21

(56) References Cited

U.S. PATENT DOCUMENTS

| | | | | |
|---|---|---|---|---|
| 3,852,563 A | | 12/1974 | Bohorquez et al. | 219/216 |
| 4,438,191 A | | 3/1984 | Cloutier et al. | 430/324 |
| 4,809,428 A | * | 3/1989 | Aden et al. | 29/611 |
| 4,847,630 A | | 7/1989 | Bhaskar et al. | 346/1.1 |
| 4,851,371 A | | 7/1989 | Fisher et al. | 437/226 |
| 4,875,968 A | | 10/1989 | O'Neill et al. | 156/633 |
| 4,894,664 A | | 1/1990 | Tsung Pan | 346/1.1 |
| 5,041,190 A | | 8/1991 | Drake et al. | 156/647 |
| 5,160,577 A | | 11/1992 | Deshpande | 156/644 |
| 5,194,877 A | | 3/1993 | Lam et al. | 346/1.1 |
| 5,211,806 A | * | 5/1993 | Wong et al. | 216/27 |
| 5,306,370 A | * | 4/1994 | Herko et al. | 216/27 |
| 5,308,442 A | | 5/1994 | Taub et al. | 156/644 |
| 5,317,346 A | | 5/1994 | Garcia | 346/140 R |
| 5,851,412 A | | 12/1998 | Kubby | 216/27 |
| 6,000,787 A | * | 12/1999 | Weber et al. | 347/65 |
| 6,153,114 A | * | 11/2000 | Figueredo et al. | 216/27 |

FOREIGN PATENT DOCUMENTS

| | | | |
|---|---|---|---|
| DE | 19536429 A1 | 4/1997 | B41J/2/135 |
| EP | 0244214 A1 | 4/1987 | B41J/3/04 |
| EP | 0783970 A2 | 7/1997 | B41J/2/16 |
| JP | 5995156 A | 10/1984 | B41J/3/04 |
| JP | 0610098557 | 5/1986 | B41J/3/04 |
| JP | 62094347 A | 4/1987 | B41J/3/04 |
| JP | 0040052144 | 2/1992 | B41J/2/16 |

* cited by examiner

*Primary Examiner*—Randy Gulakowski
*Assistant Examiner*—Shamim Ahmed

(57) ABSTRACT

One method of fabricating a fluid ejection device comprises forming a heating element on a first surface of a substrate. Adjacent the heating element, a hole is formed through the first surface to define a fill channel. The fill channel is filled with a filler material, and after filled, a fluid chamber is formed over the heating element. The filler material is removed. The fluid chamber is fluidically coupled with the fill channel, and is capable of ejecting fluid heated by the heating element.

14 Claims, 4 Drawing Sheets

FIG. 1
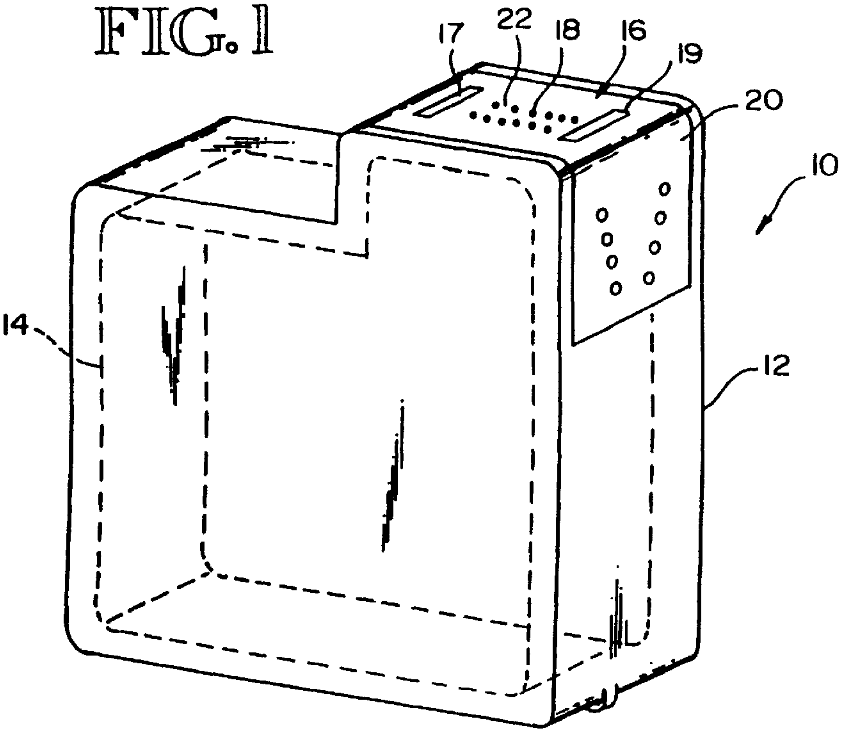
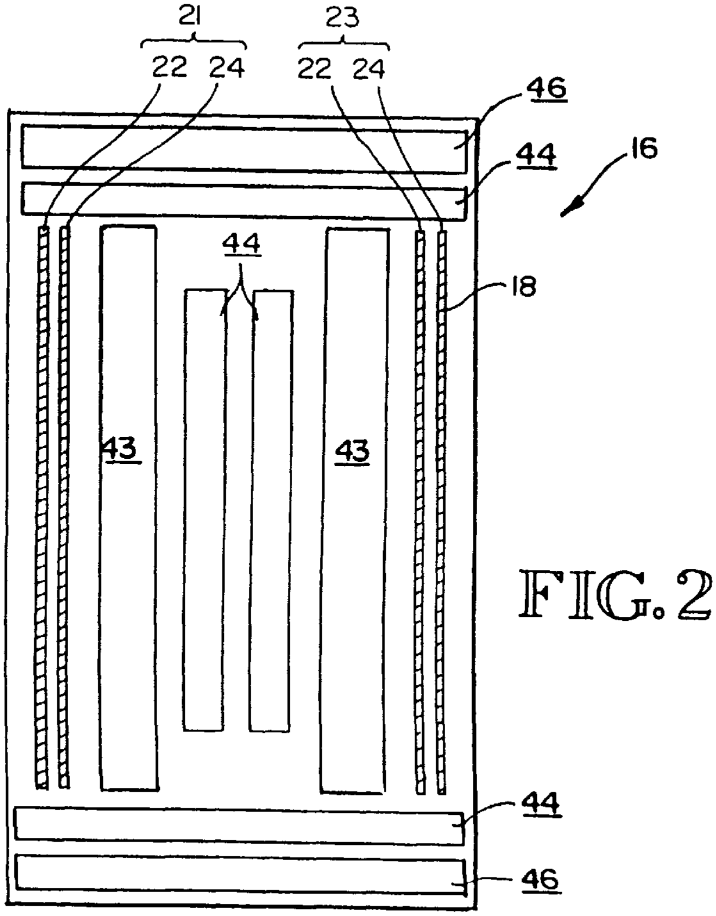
FIG. 2

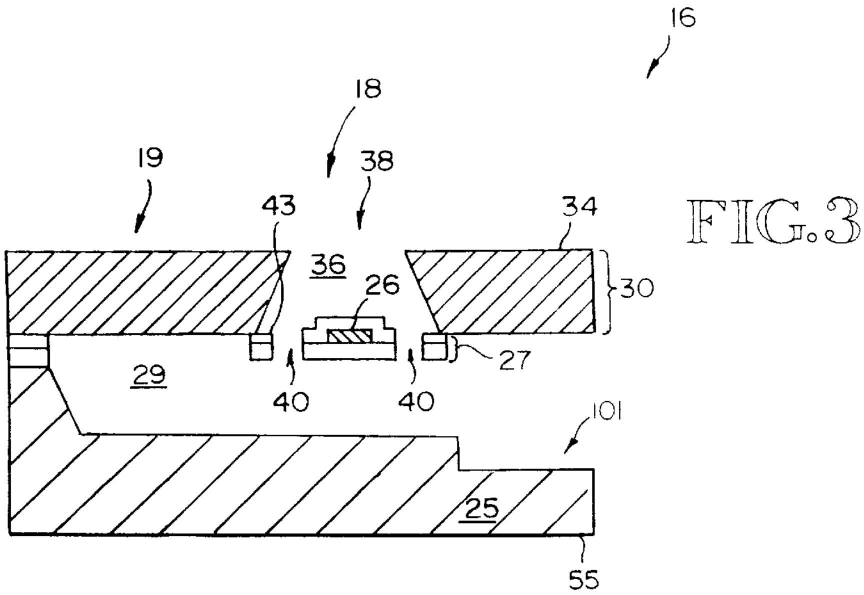
FIG. 3
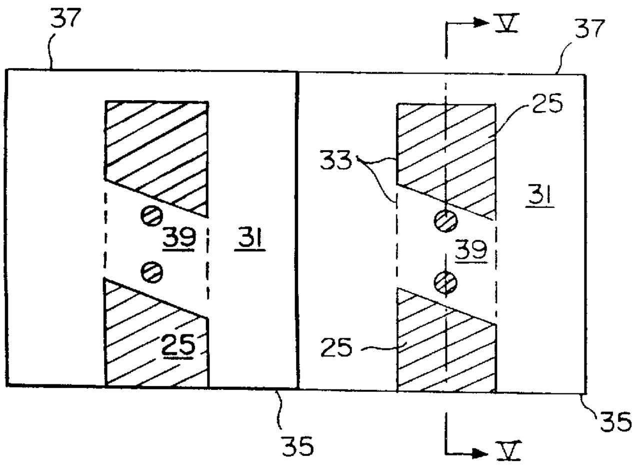
FIG. 4
FIG. 5
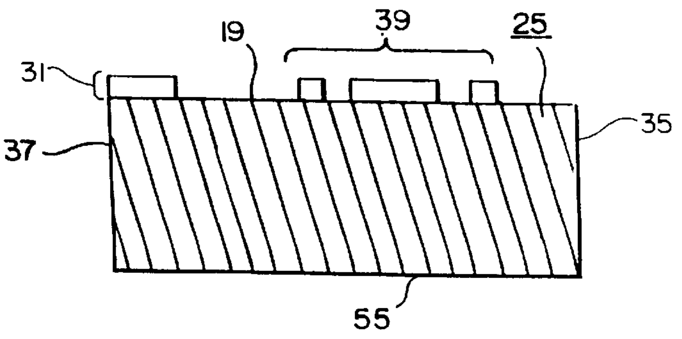

METHOD OF MANUFACTURING A FLUID EJECTION DEVICE WITH A FLUID CHANNEL THERETHROUGH

This application is a divisional of patent application Ser. No. 08/956,235 filed Oct. 22, 1997, now allowed.

BACKGROUND OF THE INVENTION

This invention relates generally to inkjet printhead fabrication processes and more particularly to methods for fabricating fully integrated inkjet printheads on a substrate.

There are known and available commercial printing devices such as computer printers, graphics plotters and facsimile machines which employ inkjet technology, such as inkjet pens. An inkjet pen typically includes an ink reservoir and an array of inkjet printing elements. The array is formed by an inkjet printhead. Each printing element includes a nozzle chamber, a firing resistor and a nozzle opening. Ink is stored in the reservoir and passively loaded into respective firing chambers of the printhead via an ink refill channel and respective ink feed channels. Capillary action moves the ink from the reservoir through the refill channel and ink feed channels into the respective firing chambers. Printer control circuitry outputs respective signals to the printing elements to activate corresponding firing resistors. In response an activated firing resistor heats ink within the surrounding nozzle chamber causing an expanding vapor bubble to form. The bubble forces ink from the nozzle chamber out the nozzle opening. An orifice plate adjacent to the barrier layer defines the nozzle openings. The geometry of the nozzle chamber, ink feed channel and nozzle opening defines how quickly a corresponding nozzle chamber is refilled after firing.

To achieve high quality printing ink drops or dots are accurately placed at desired locations at designed resolutions. Printing at resolutions of 300 dots per inch and 600 dots per inch is known. Higher resolutions also are being sought.

A monolithic structure for an inkjet printhead is described in copending U.S. patent application Ser. No. 08/597,746 filed Feb. 7, 1996 for "Solid State Ink Jet Print Head and Method of Manufacture." The process described therein includes photoimaging techniques similar to those used in semiconductor device manufacturing. The printing elements of a monolithic printhead are formed by applying layers to a silicon die. The firing resistors, wiring lines and nozzle chambers are formed by applying various passivation, insulation, resistive and conductive layers on the silicon die. Such layers are referred to collectively as a thin film structure. An orifice plate overlays the thin film structure opposite the die. Nozzle openings are formed in the orifice plate in alignment with the nozzle chambers and firing resistors. The geometry of the orifice openings affect the size, trajectory and speed of ink drop ejection. Orifice plates often are formed of nickel and fabricated by lithographic and electroforming processes.

SUMMARY OF THE INVENTION

In one embodiment of the present invention, a method of fabricating a fluid ejection device comprises forming a heating element on a first surface of a substrate. Adjacent the heating element, a hole is formed through the first surface to define a fill channel. The fill channel is filled with a filler material, and after filled, a fluid chamber is formed over the heating element. The filler material is removed. The fluid chamber is fluidically coupled with the fill channel, and is capable of ejecting fluid heated by the heating element.

These and other aspects and advantages of the invention will be better understood by reference to the following detailed description taken in conjunction with the accompanying drawings.

BRIEF DESCRIPTION OF THE DRAWINGS

FIG. 1 is a perspective view of an inkjet pen having a printhead fabricated according to an embodiment of this invention;

FIG. 2 is a block diagram of an embodiment of the inkjet printhead;

FIG. 3 is a partial cross-sectional view of an embodiment of the inkjet printhead fabricated according to one methodology of this invention;

FIG. 4 is a partial plan view of one embodiment of a die having a patterned layer of field oxide;

FIG. 5 is a cross-sectional view taken along line V—V of FIG. 4;

DESCRIPTION OF SPECIFIC EMBODIMENTS

Overview

Figure 8:
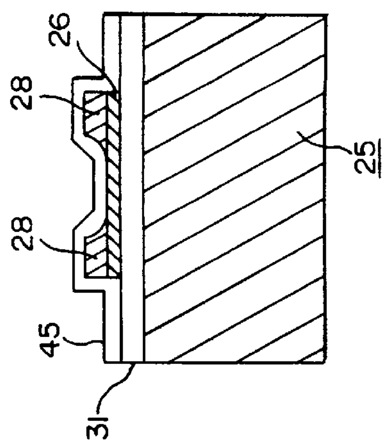
FIG. 8 is a cross-sectional view along line VIII—VIII of FIG. 6.

FIG. 1 shows a scanning-type thermal inkjet pen 10 according to an embodiment of this invention. The pen 10 is formed by a pen body 12, an internal reservoir 14 and a printhead 16. The pen body 12 serves as a housing for the reservoir 14. The reservoir 14 is for storing ink to be ejected from the printhead 16 onto a media sheet. The printhead 16 defines an array 22 of printing elements 18 (i.e., nozzle array). The nozzle array 22 is formed on a die. The reservoir 14 is in physical communication with the nozzle array enabling ink to flow from the reservoir 14 into the printing elements 18. Ink is ejected from a printing element 18 through an opening toward a media sheet to form dots on the media sheet.

The openings are formed in an orifice layer. In one embodiment the orifice layer is a plate attached to the underlying layers. In another embodiment the orifice layer is formed integrally with the underlying layers. In an exemplary embodiment of a printhead having an orifice plate, openings also are formed in a flex circuit 20. The flex circuit 20 is a printed circuit made of a flexible base material having multiple conductive paths and a peripheral connector. Conductive paths run from the peripheral connector to the nozzle array 22. The flex circuit 20 is formed from a base material made of polyimide or other flexible polymer material (e.g., polyester, poly-methyl-methacrylate) and conductive paths made of copper, gold or other conductive material. The flex circuit 20 with only the base material and conductive paths is available from the 3M Company of Minneapolis, Minn. The nozzle openings and peripheral connector then are added. The flex circuit 20 is coupled to off-circuit printer control electronics via an edge connector or button connector. Windows 17, 19 within the flex circuit 20 facilitate mounting of the printhead 16 to the pen 10. During operation signals are received from the printer control circuitry and activate select printing elements 18 to eject ink at specific times causing a pattern of dots to be output onto a media sheet. The pattern of dots forms a desired symbol, character or graphic.

Although a scanning-type inkjet pen is shown in FIG. 1, the fabrication processes for the printhead 16 to be described below also apply to printheads for a wide-array printhead, such as a non-scanning page-wide array printhead.

As shown in FIG. 2, the printhead 16 includes multiple rows of printing elements 18. In the embodiment shown two rows 22, 24 form one set of rows 21, while another two rows 22, 24 form another set of rows 23. In alternative embodiments fewer or more rows are included. Associated with each printing element 18 is a driver for generating the current level to achieve the desired power levels for heating the element's firing resistor (or heating element). Also included is logic circuitry for selecting which printing element is active at a given time. Driver arrays 43 and logic arrays 44 are depicted in block format. The firing resistor (or heating element) of a given printing element is connected to a driver by a wiring line. Also included in the printhead 16 are contacts pad arrays 46 for electrically coupling the integrated portion of the printhead to a flex circuit or to off-pen circuitry.

FIG. 3 shows a printing element 18 of a printhead 16. The printhead includes a silicon die 25, a thin film structure 27 and an orifice layer 30. The silicon die 25 provides rigidity and in effect serves as a chassis for other portions of the printhead 16. An ink feed channel 29 is formed in the die 25. In one embodiment an ink feed channel 29 is formed for each printing element 18. The thin film structure 27 is formed on the die 25, and includes various passivation, insulation and conductive layers. A firing resistor 26 and conductive traces 28 (see FIGS. 9 and 17) are formed in the thin film structure 27 for each printing element 18. The orifice layer 30 is formed on the thin film structure 27 opposite the die 25. The orifice layer 30 has an exterior surface 34 which during operation faces a media sheet on which ink is to be printed. The orifice layer is either an integral layer formed with the thin film structure 27 or is a plate overlaid on the thin film structure. In some embodiments the flex circuit 20 overlays the orifice layer 30. Nozzle chambers 36 and nozzle openings 38 are formed in the orifice layer 30.

Each printing element 18 includes a firing resistor 26, a nozzle chamber 36, a nozzle opening 38, and one or more fill channels 40. A center point of the firing resistor 26 defines a normal axis about which components of the printing element 18 are aligned. Specifically it is preferred that the firing resistor 26 be centered within the nozzle chamber 36 and be aligned with the nozzle opening 38. The nozzle chamber 36 in one embodiment is frustoconical in shape. One or more fill channels 40 or vias are formed in the thin film structure 27 to couple the nozzle chamber 36 to the feed channel 29. The fill channels 40 are encircled by the nozzle chamber lower periphery 43 so that the ink flowing through a given fill channel 40 flows exclusively into a corresponding nozzle chamber 36.

In one embodiment there is one feed channel 29 for each printing element 18. The feed channels 29 for a given set of rows 21 or 23 receive ink from a refill channel that is adjacent an interface between the substrate and the reservoir 14 (not shown). In an edge feed construction there is a refill channel 101 on each of two opposing side edges of the printhead. The feed channels 29 from one set of printing elements 21 are in communication with one refill channel, while the feed channels 29 from the other set of printing elements 23 are in communication with the other refill channel. In a center feed construction, there is a refill channel trough in communication with the feed channels. Such refill channel trough serves both sets of printing elements 21, 23. In one embodiment, the trough receives ink from a pen cartridge reservoir at an edge of the printhead. Thus, in the embodiments described the refill channel 101 does not extend through to the bottom surface 55 of the die 25.

In an exemplary embodiment, the die 25 is a silicon die approximately 675 microns thick. Glass or a stable polymer are used in place of the silicon in alternative embodiments. The thin film structure 27 is formed by one or more passivation or insulation layers formed by silicon dioxide, silicon carbide, silicon nitride, tantalum, poly silicon glass, or another suitable material. The thin film structure also includes a conductive layer for defining the firing resistor and for defining the conductive traces. The conductive layer is formed by tantalum, tantalum-aluminum or another metal or metal alloy. In an exemplary embodiment the thin film structure is approximately 3 microns thick. The orifice layer 30 has a thickness of approximately 10 to 30 microns. The nozzle opening 38 has a diameter of approximately 10–30 microns. In an exemplary embodiment the firing resistor 26 is approximately square with a length on each side of approximately 10–30 microns. The base surface 43 of the nozzle chamber 36 supporting the firing resistor 26 has a diameter approximately twice the length of the resistor 26. In one embodiment an anisotropic silicon etch defines 54° wall angles for the feed slot 29. Although exemplary dimensions and angles are given, such dimensions and angles mary vary for alternative embodiments.

Single-Side Fabrication

For naming convention purposes the die 25 has two sides, a top side 19 and a bottom side 55. The top side defines a top surface and the bottom side defines a bottom surface. For a rectilinear die 25, the die 25 also includes four edges extending between the top side and bottom side. The shape and number of edges of the die may vary in alternative embodiments. According to the invention, a monolithic inkjet printhead 16 is formed with fabrication processes acting from a single side of the substrate. In some embodiments the fabrication processes also act from an edge during at least one step of the fabrication. According to the invention, however, the fabrication processes need not act from the bottom side of the die 25. The term substrate as used herein refers to the in-process structure of the die 25 and thin film structure 27, and when present, the orifice layer 30.

Starting with a planar die 25, a layer of field oxide 31 is applied (e.g., grown) to a first side 19. The field oxide layer 25 then is masked and etched as shown in FIGS. 4 and 5 to delimit areas 33 for respective feed channels. In addition a membrane region 39 is formed within each feed channel area 33. The feed channel area 33 extends from an edge 35 of the die 25 toward an opposite edge 37. Once the feed channel is etched in the area 33 at a later stage, the feed channel 29 will extend from the side edge 35 toward the opposite edge 39. The resulting printhead is to be an edge feed printhead with ink entering the feed channel 29 from the reservoir 14 at the edge 35 (see FIG. 3). A shelf is formed at the edge and serves as the refill channel 101.

The membrane region 39 occurs within the feed channel area 33 and marks regions of the field oxide to remain overlaying the corresponding feed channel 29. At this stage in the fabrication there is no feed channel etched into the die 25, just an area 33 delimited by the field oxide layer 31.

Figure 7:
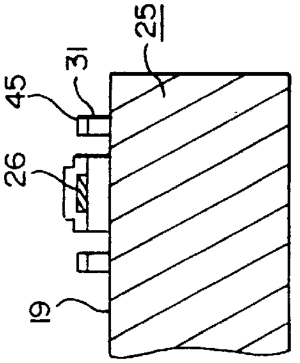
FIG. 7 is a cross-sectional view along line VII—VII of FIG. 6.
Figure 6:
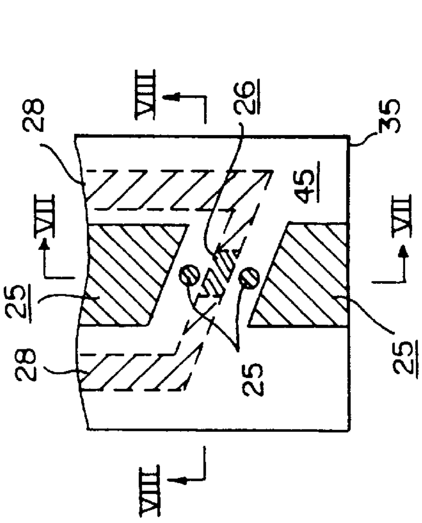
FIG. 6 is a partial plan view of a printhead in one process embodiment with the thin film structure layers applied and patterned.

The field oxide is a first layer of the thin film structure 27. With the field oxide layer 31 patterned as desired, additional layers of the thin film structure 27 are applied to the same side 19 of the die 25 having the field oxide 31. The additional layers are patterned to form firing resistors 26, wiring lines 28 and passivation 45 as shown in FIGS. 6–8. Deposition, masking and etching processes as known in the art are used to apply and pattern the firing resistors 26, wiring lines 28 and passivation material 45. In one embodiment the firing resistors 26 are formed of tantalum-aluminum and the wiring lines 28 are formed of aluminum. In another embodiment different or additional conductive metals, alloys or stacks of metals and/or alloys are used. FIG. 6 shows a plan view of a portion of the printhead 16. The entire surface of the substrate is covered with passivation material 45 other than the areas labeled as the die 25. In FIG. 6 the wiring lines 28 and firing resistor 26 are shown hidden underlying the passivation layer 45. At this stage of the fabrication, the feed channel 29 still has not been etched in the area 33.

Figure 11:
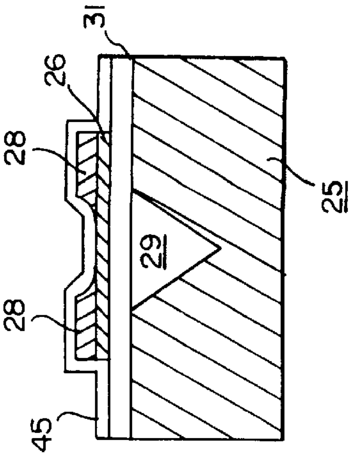
FIG. 11 is a cross-sectional view along line XI—XI of FIG. 9.
Figure 10:
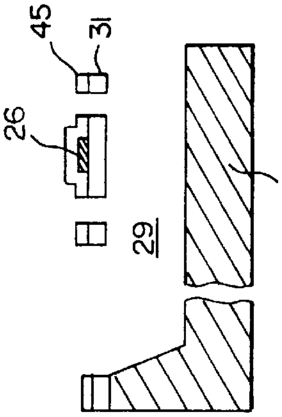
FIG. 10 is a cross-sectional view along line X—X of FIG. 9.
Figure 9:
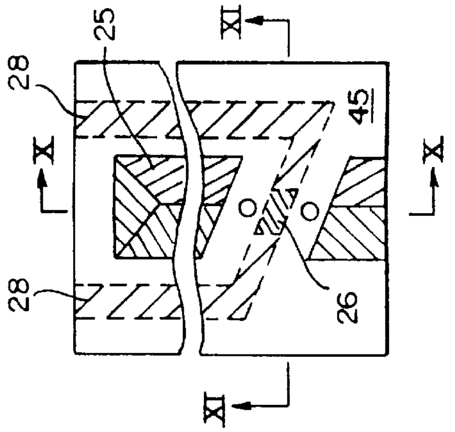
FIG. 9 is a partial plan view of a printhead in another process embodiment with the feed channel and fill channels etched out of the die.

With the firing resistors 26 and wiring lines 28 patterned, the next step is to etch the feed channel 29 and the fill channels 40. An etchant is applied to the top side 19. The die 25 is etched using tetra-methyl ammonium hydroxide, potassium hydroxide or another anisotropic silicon etchant which acts upon the exposed die 25 regions and not upon the passivation 45. In one embodiment the etchant works upon the <100> plane of the silicon die to etch the silicon at an angle. The etching process continues with the silicon etched away downward at an angle until the angled lines intersect at a given depth. The result is a triangular trench for the feed channel 29 as shown in FIGS. 9–11. At this stage a trench has been created in the die 25 using a process acting from the top side 19 of the die 25. The trench defines the feed channel 29.

Figure 12:
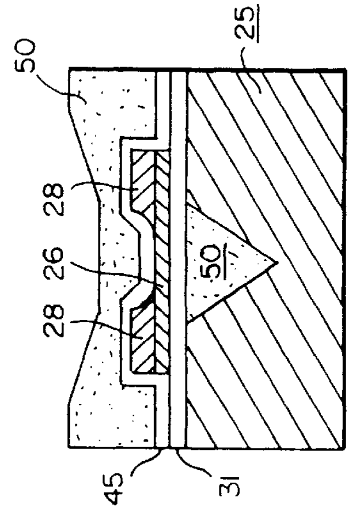
FIG. 12 is a partial cross-sectional view of a printhead in process with filler material added to the structure of FIG. 9.
Figure 13:
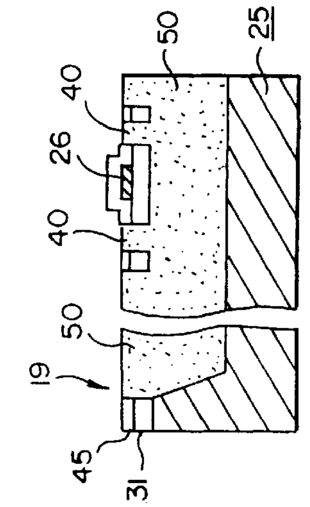
FIG. 13 is a partial cross-sectional view of a printhead in process after polishing and a plasma etching the structure of FIG. 12.
Figure 14:
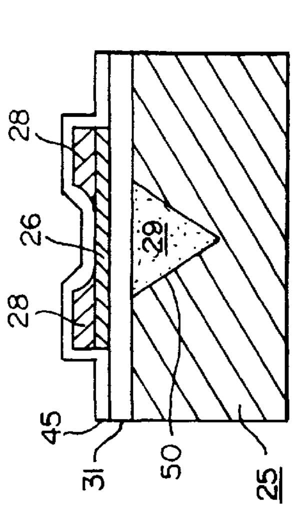
FIG. 14 is another partial cross-sectional view of a printhead in process after polishing and a plasma etching the structure of FIG. 12.

At this stage of the fabrication the feed channels 29, the fill channels 40, the firing resistors 26 and the wiring lines 28 have been formed, but the nozzle chambers 36 (see FIG. 3) have not yet been formed. The nozzle chambers 36 are to be formed with an orifice plate, with an orifice film or by direct imaging. For any of such methods the presence of the feed channel 29 and fill channels 40 can adversely impact the formation of the nozzle chambers 36 due to the varied topography introduced by such voids. Such voids are filed up to enable continued processing from the top surface. Thus, according to an aspect of this invention, a material 50 of photoresist or polyimide is spun and baked onto the substrate as shown in FIG. 12. The material 50 fills in the feed channel 29 and fill channels 40 and covers the passivation layer 45. Next, a chemical-mechanical polishing process is applied to the substrate to remove the material 50 in areas other than the feed channels 29 and fill channels 40, as shown in FIGS. 13 and 14. In one embodiment an $O_2$ plasma etch also is performed so that the filler material 50 is removed without removing the passivation material 45. The result is a planar surface with bumps of passivation material 45 over the firing resistors 26 (see FIGS. 13 and 14). The top side 19 of the substrate now has areas of passivation material 45 and filler material 50. At this stage of the fabrication the substrate is ready for processes to form the nozzle chambers 36.

Figure 15:
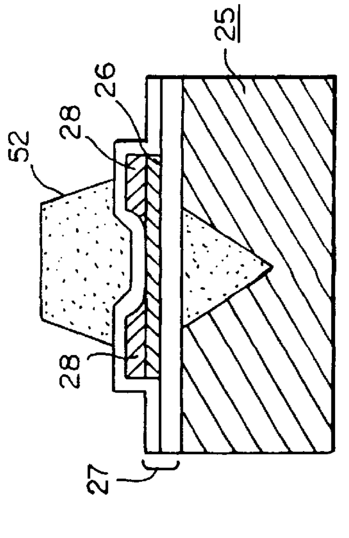
FIG. 15 is a partial cross-sectional view of a printhead in process after applying a sacrificial mandrel to the structure of FIGS. 13 and 14.
Figure 16:
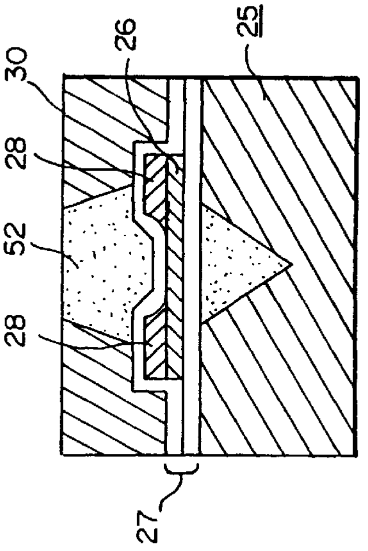
FIG. 16 is a partial cross-sectional view of a printhead in process after applying an orifice plate around the sacrificial mandrel of FIG. 15.
Figure 17:
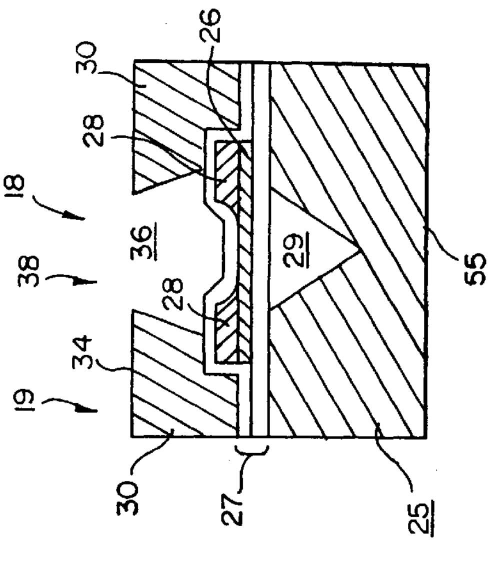
FIG. 17 a partial cross-sectional view of a completed printhead with the sacrificial mandrel of FIG. 15 and filler material removed.

In one embodiment (see FIG. 15) a frustoconical sacrificial mandrel 52 is formed over each resistor 26 in the shape of the desired nozzle chamber. Such sacrificial mandrel 52 is formed by depositing a suitable material, such as photoresist or polyimide, then patterning and etching the material to the desired shape. Next an orifice layer 30 is applied as shown in FIG. 16 to a thickness flush with the sacrificial mandrel 52. In one embodiment the orifice layer is applied by an electroplating process, in which the substrate is dipped into an electroplating tank. Material (e.g., nickel, gold) forms on the substrate around the sacrificial mandrel 52. Other deposition processes also may be used, but may be accompanied by an additional polishing step to level the layer 30 to the sacrificial mandrel 52. Next, the sacrificial mandrel 52 is etched or dissolved away from the orifice layer 30, leaving the remaining nozzle chamber 36 as shown in FIG. 17. In the same step or in another etching step, the filler material 50 is etched out of the fill channels 40 and the feed channels 29 resulting in a printhead 16 as shown in FIGS. 3 and 17. The filler material 50 is etched from the top side 19 of the substrate or from the top side 19 and the edge fill side 35 of the substrate. For either case, the fabrication processes do not act from the bottom surface 55 (see FIGS. 3 and 17) opposite side 19.

Although the nozzle chambers 36 are described as being formed by applying a sacrificial mandrel and orifice layer then etching out the sacrificial mandrel, other processes also may be used. In one alternative embodiment, an orifice film is applied to the substrate as the substrate appears in FIG. 14. Patterning and etching processes then are performed to define the nozzle chamber 36. An etching process as described above then is performed to remove the filler material 50 from the feed channel(s) 29 and fill channels 40. In still another embodiment material is spun onto the substrate, masked and exposed to form the nozzle chambers 36. Again an etching process as described above is performed afterward to remove the filler material 50 from the feed channels 29 and fill channels 40.

Upon completion there is a printhead 16 without any ink channel openings in the bottom surface of the bottom side 55. More specifically, no portion of the bottom side 55 has been removed for ink channel openings.

Although preferred embodiments of the invention have been illustrated and described, various alternatives, modifications and equivalents may be used. Therefore, the foregoing description should not be taken as limiting the scope of the inventions which are defined by the appended claims.

What is claimed is:

1. A method for fabricating a monolithic inkjet printhead on a die having a first surface, an opposite second surface, and an edge surface extending from the first surface to the second surface, the printhead having a plurality of printing elements, the method comprising the steps of:

forming a first layer on the first surface of the die;

defining a pattern in the first layer delimiting a first area for an ink feed channel, along with a membrane area within the first area, the membrane area defining openings for ink fill channels, the defined pattern leaving an exposed portion of the first surface;

depositing at least one conductive layer onto at least a portion of the first layer to define a plurality of firing resistors and wiring lines, said at least one conductive layer deposited to a side of the first layer opposite from the die, wherein said at least one conductive layer does not physically contact the die;

depositing at least one passivation layer overlaying the first layer and at least one conductive layer without overlaying the exposed portion of the die's first surface;

etching a feed channel through the exposed portion of the die's first surface;

applying a filler material to occupy the feed channel and the defined openings in the membrane;

planarizing exposed areas of the filler material;

after the step of planarizing, forming an orifice layer overlaying the passivation layer and feed channel, the orifice layer defining a plurality of nozzle chambers, each one of the plurality of nozzle chambers aligned with at least one of the plurality of firing resistors; and removing the filler material within the feed channel and defined openings in the membrane, wherein the defined openings serve as fill channels connecting nozzle chambers to the feed channel; and wherein each one of the plurality of printing elements comprises a firing resistor and nozzle chamber and a fill channel, the fill channel extending from the nozzle chamber to the feed channel, and wherein for each one of the plurality of printing elements a respective wiring line is conductively coupled to the firing resistor of said one printing element.

2. The method of claim 1, wherein the step of forming an orifice layer comprises:

for each one firing resistor applying a sacrificial mandrel over said one firing resistor;

applying an orifice layer around the sacrificial mandrels;

removing the sacrificial mandrel material to form respective inkjet nozzle chambers and nozzle openings.

3. The method of claim 1, in which the passivation layer and the plurality of firing resistors and wiring lines are part of a thin film structure residing between the die and the orifice layer.

4. A method for fabricating a monolithic inkjet printhead on a die having a first surface, an opposite second surface, and an edge surface extending from the first surface to the second surface, the printhead having a plurality of printing elements, the method comprising the steps of:

applying a first passivation layer to the first surface of the die, wherein a portion of the die's first surface remains exposed;

applying an array of firing resistors and wiring lines to the first passivation layer;

etching a feed channel through the exposed portions of the die's first surface;

applying a filler material to occupy the feed channel;

planarizing exposed areas of the filler material;

after the step of applying a filler material, forming an orifice layer overlaying the first passivation layer and the array of firing resistors and wiring lines, the orifice layer defining a plurality of nozzle chambers, each one of the plurality of nozzle chambers aligned with at least one of the plurality of firing resistors; and removing the filler material from the feed channel; and wherein each one of the plurality of printing elements comprises a firing resistor and nozzle chamber and a fill channel, the fill channel extending from the nozzle chamber to the feed channel, and wherein for each one of the plurality of printing elements a respective wiring line is conductively coupled to the firing resistor of said one printing element.

5. A method of fabricating a fluid ejection device, the method comprising:

forming a heating element on a first surface of a substrate;

adjacent the heating element, forming a hole through the first surface to define a fill channel;

filling the fill channel with a filler material;

after filling the fill channel, forming a fluid chamber over the heating element; and removing the filler material, wherein the fluid chamber is fluidically coupled with the fill channel, wherein the fluid chamber is capable of ejecting fluid heated by the heating element.

6. The method of claim 5 further comprising forming a feed channel in the substrate that is fluidically coupled with the fill channel; and filling the feed channel with the filler material.

7. The method of claim 5 wherein the step of forming the fluid chamber includes:

applying a sacrificial mandrel over the heating element;

applying a layer around the sacrificial mandrel; and removing the sacrificial mandrel to form the fluid chamber and nozzle openings.

8. A method of fabricating a fluid ejection device comprising:

forming a heating element on a top surface of a substrate;

applying a sacrificial mandrel over the heating element;

applying a layer around the sacrificial mandrel; and removing the sacrificial mandrel to form a fluid chamber capable of ejecting fluid heated by the heating element.

9. The method of claim 8 wherein the sacrificial mandrel is one of photoresist and polyimide.

10. The method of claim 8 wherein the mandrel is patterned and etched to a desired shape for the firing chamber.

11. The method of claim 8 wherein the layer applied around the sacrificial mandrel is an orifice layer.

12. The method of claim 11 wherein the layer applied around the sacrificial mandrel is one of gold and nickel.

13. The method of claim 8 wherein the sacrificial mandrel is removed by an etchant.

14. The method of claim 8 further comprising:

forming a hole through the first layer to define a fill channel;

forming a feed channel in the substrate that is fluidically coupled with the fill channel, wherein the fill channel is fluidically coupled with the firing chamber.

* * * * *